United States Patent
Smith et al.

(10) Patent No.: US 6,609,294 B1
(45) Date of Patent: Aug. 26, 2003

(54) METHOD OF BULK FABRICATING PRINTED WIRING BOARD LAMINATES

(75) Inventors: Christopher Vernon Smith, Henniker, NH (US); Richard Allen Correia, Tilton, NH (US); Ed Carignan, Los Gatos, CA (US)

(73) Assignee: Polyclad Laminates, Inc., Franklin, NH (US)

( * ) Notice: Subject to any disclaimer, the term of this patent is extended or adjusted under 35 U.S.C. 154(b) by 274 days.

(21) Appl. No.: 09/671,386

(22) Filed: Sep. 27, 2000

(51) Int. Cl.[7] ............................. B23P 17/00; H05K 3/36
(52) U.S. Cl. ........................ 29/830; 29/411; 29/412; 29/417; 264/642; 264/157
(58) Field of Search ................. 29/411, 412, 417, 29/830; 264/642, 157, 345, 347

(56) References Cited

U.S. PATENT DOCUMENTS

| | | | |
|---|---|---|---|
| 4,201,616 A | * 5/1980 | Chellis et al. | 156/307.1 |
| 4,314,002 A | * 2/1982 | Oizumi et al. | 428/414 |
| 4,755,911 A | * 7/1988 | Suzuki | 361/795 |
| 4,875,283 A | * 10/1989 | Johnston | 29/830 |
| 4,961,806 A | * 10/1990 | Gerrie et al. | 156/252 |
| 5,153,050 A | * 10/1992 | Johnston | 428/209 |
| 5,674,596 A | * 10/1997 | Johnston | 428/209 |

* cited by examiner

Primary Examiner—Timothy V. Eley
(74) Attorney, Agent, or Firm—Mintz, Levin, Cohn, Ferris, Glovsky and Popeo, P.C.

(57) ABSTRACT

A novel process for fabricating metal clad laminates used in the manufacture of printed wiring boards. The process which eliminates multiple use separator plates within laminate books during buildup and pressing, utilizes a sacrificial separator sheet between copper sheets and wherein the separator sheet remains intact throughout the pressing and cutting steps and is finally removed after the laminates have been sized to the desired dimensions. This process provides time and cost savings, as well as a significant increase in quality and quantity of the laminates produced.

11 Claims, 6 Drawing Sheets

METHOD OF BULK FABRICATING PRINTED WIRING BOARD LAMINATES

FIELD OF THE INVENTION

The invention is in the field of metal clad laminates used to manufacture printed wiring boards. More particularly, the invention relates to a process for fabricating laminates to desired dimensions from a block of laminates.

BACKGROUND OF THE INVENTION

In its simplest form, a printed wiring board laminate includes, as a component, a dielectric layer of either a reinforced or non reinforced resin that is known in the art as a prepreg. On the opposite sides of the prepreg are bonded conductive metal foil sheets. Subsequently, after curing, the metal on the laminate, through a number of photolithographic processes, is etched to produce conductive paths, or circuits, on the surface of the cured dielectric layer. This layer may be used individually as a two sided printed wiring board, or assembled with other etched layers to produce a multilayer printed wiring board.

These laminates are typically assembled by alternately stacking conductive metal foil sheets, prepreg sheets and separator sheets into a press "book". The book is then inserted into a lamination press where it is cured under heat and pressure into a printed wiring board laminate. After pressing, the cured, metal-clad laminates are typically detached from the separator sheets and are subjected to further processing.

Of extreme importance in the manufacture of these laminates is the requirement for preventing and eliminating, to the greatest possible extent, contamination of the metallic foil sheets and maintaining cleanliness during the manufacturing process. It is known that the main cause of contamination is the presence of resin dust, fiberglass various other types of foreign material resulting from earlier manufacture and cutting of the laminates. During the manufacturing process, great care is taken to prevent resin dust and other contaminants from settling on the metallic surfaces.

It is of additional importance in the manufacture of laminates for printed wiring boards to increase the quantity of laminates produced while reducing the costs associated with materials and labor.

Laminates can be produced with metallic or composite separator sheets which inhibit laminates from adhering to each other and imparting their surface finish to the laminate. Generally, books of laminate containing separator sheets are separated or broken down prior to being cut into panels of desired sizes and dimensions. The laminates are generally pressed between thick metallic plates to maintain flatness and to assure the application of even pressure. The metallic plates represent a significant capital investment. Typically, 8–30 laminates are pressed in a book inserted into each opening within a multi opening press. Laminates may also be formed using a thin, sacrificial separator sheet. After pressing, the laminates are sent to a breakdown system, which may be manual or automatic, during which the metallic plates and/or separator sheets are removed. Following breakdown, the laminates either proceed directly to or are stacked prior to an automated or manual fabrication system to be cut one at a time.

The process of breaking down the books prior to cutting makes the laminates vulnerable to handling damage, contamination and staining as discussed hereinabove. Handling laminates in full sheet size also magnifies the chances of damage from bending or edge impacts during cutting. Additionally, handling the laminates in full sheet size requires additional process steps which decreases quantity output and overall productivity.

It is obvious from the foregoing that the elimination of handling damage and contamination incurred during the breakdown of the books, as well as increasing the quantity and quality output of laminates, in addition to reducing labor and costs of production by simplifying the process, is extremely important with regard to the manufacture of laminates used in the manufacture of printed wiring boards.

SUMMARY OF THE INVENTION

The present invention offers productivity and quality advantages associated with the production of laminates used in the manufacture of printed wiring boards. More particularly, the present invention is directed to a process for producing laminates in good quantity and with a significant decrease in imperfections. As used herein, the term "laminate" refers to a single metal-dielectric-metal layered sheet that has been bonded together in a press during which the cure reaction of the resin is completed. The process according to the present invention is generally directed to cutting stacks comprising a plurality of laminates separated from one another by a separator component, generally in the form of separator sheets, without removing the separator sheets upon the transfer of the laminate stack from the press to the cutting apparatus. In this manner, the laminates are pressed with the separator sheets intact and the separator sheets will be sacrificial. By cutting an entire book comprised of numerous stacks with the separator sheets intact, the chances for damaging the surface of the laminate or the chances of introducing handling damage are significantly reduced. Cutting the book of laminates with the separator sheets retained therein significantly reduces the time and labor required to break down the separator sheet from the laminates as was required in prior art laminate cutting processes. Furthermore, cutting the books, or partial, or multiple books, with the separator sheet intact stabilizes the laminate during cutting. The stabilization of the laminate results in very high edge quality on the panels, which allows for the introduction into a clean room environment without secondary cleaning.

The process of the present invention provides for the buildup of a laminate which may comprise a plurality of copper-clad laminates separated by sheets of aluminum, steel, composite or other materials, which may be attached to the separator sheet using for example, CAC™ (copper/aluminum/copper, which is described in U.S. Pat. No. 5,153,050), or other joining methods or positioned freely between the laminates. CAC™ is commercially available from Gould Electronics Inc., Foil Divisision, Eastlake, Ohio The book of laminates is then placed in a curing press and pressed into a cured block. Without breaking down the cured block of laminates and removing the separator components, the book is transferred to a cutting apparatus, such as a paneling saw or router, which is capable of fabricating multiple laminates simultaneously. One or more books, or partial books, can be fabricated at the same time. Finally, the laminates are sized to predetermined consumer-selected dimensions.

The above description sets forth rather broadly the more important features of the present invention in order that the detailed description thereof that follows may be understood, and in order that the present contributions to the art may be better appreciated. Other objects and features of the present invention will become apparent from the following detailed description considered in conjunction with the accompanying drawings. It is to be understood, however, that the drawings are designed solely for the purposes of illustration and not as a definition of the limits of the invention, for which reference should be made to the appended claims.

DETAILED DESCRIPTION OF THE DRAWINGS

In the drawings in which like reference characters denote similar elements throughout-the several views.

In the figures of the present application, two-digit numerals refer to parts involved in the process of the invention, and three-digit numerals refer to steps used to describe the process of the invention.

DETAILED DESCRIPTION OF THE INVENTION

Figure 1:
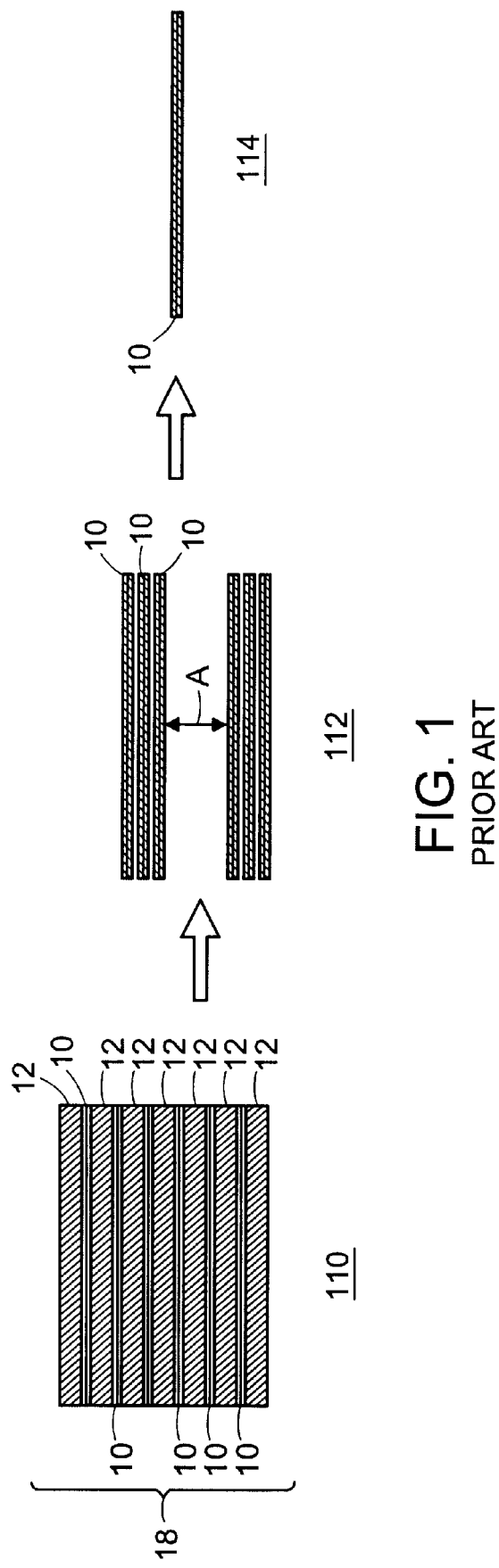
FIG. 1 is a schematic illustration of a prior art process for pressing, stacking and cutting copper clad laminates.

Presently, the process of preparing laminates for use in the manufacture of printed wiring boards proceeds as illustrated in FIG. 1, wherein a plurality of laminates 10 are stacked and positioned between press platens (not shown) of a curing press. Laminates 10 are generally comprised of two copper foil sheets 14 having one or more epoxy coated fiberglass layers or prepregs, 16, sealed between the copper sheets 14 (see FIG. 3).

Figures 3, 4:
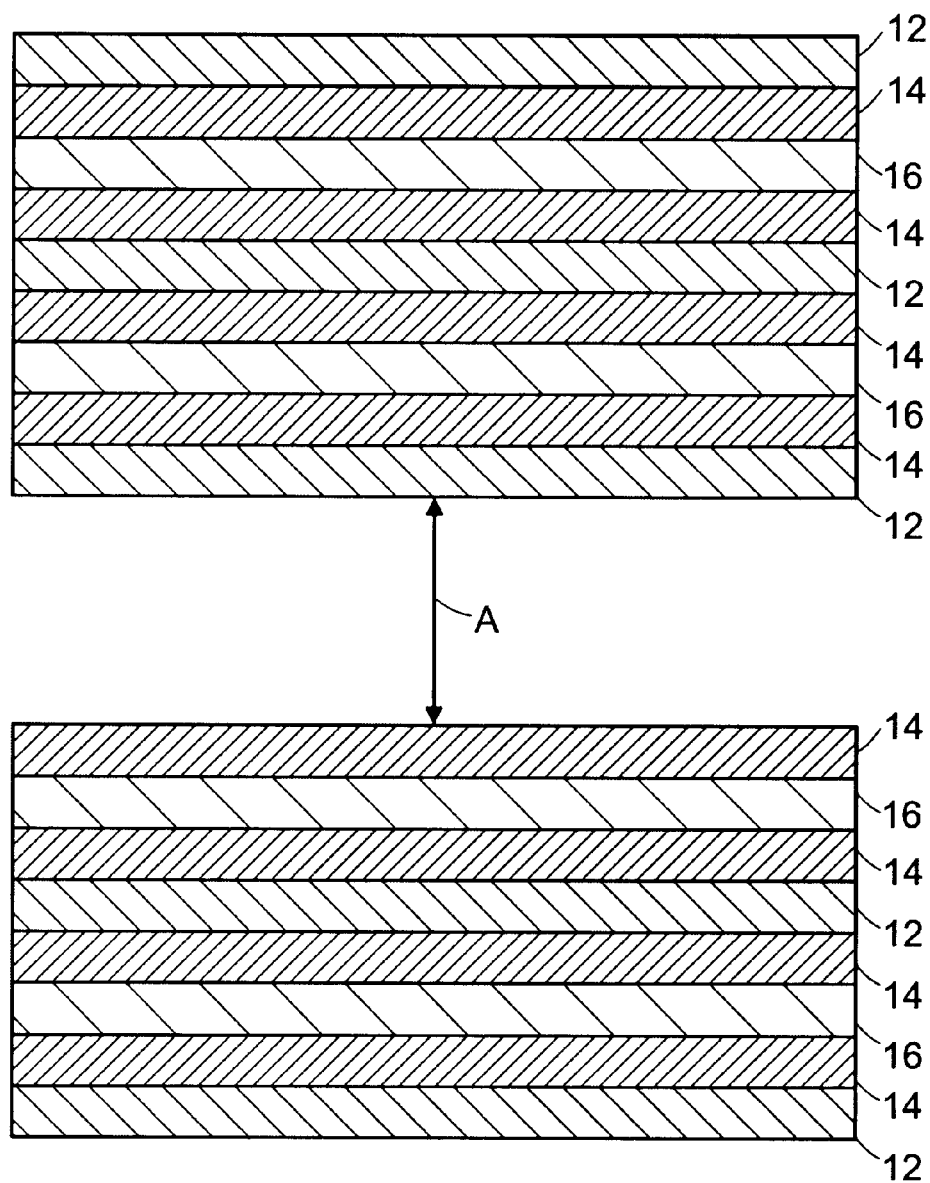
FIG. 3 is a close-up side view of a laminate indicated as 10 in FIGS. 1 and 2.
FIG. 4 is a side view of the layers of a prior art laminate book prior to removal from a curing press.
Figure 5:
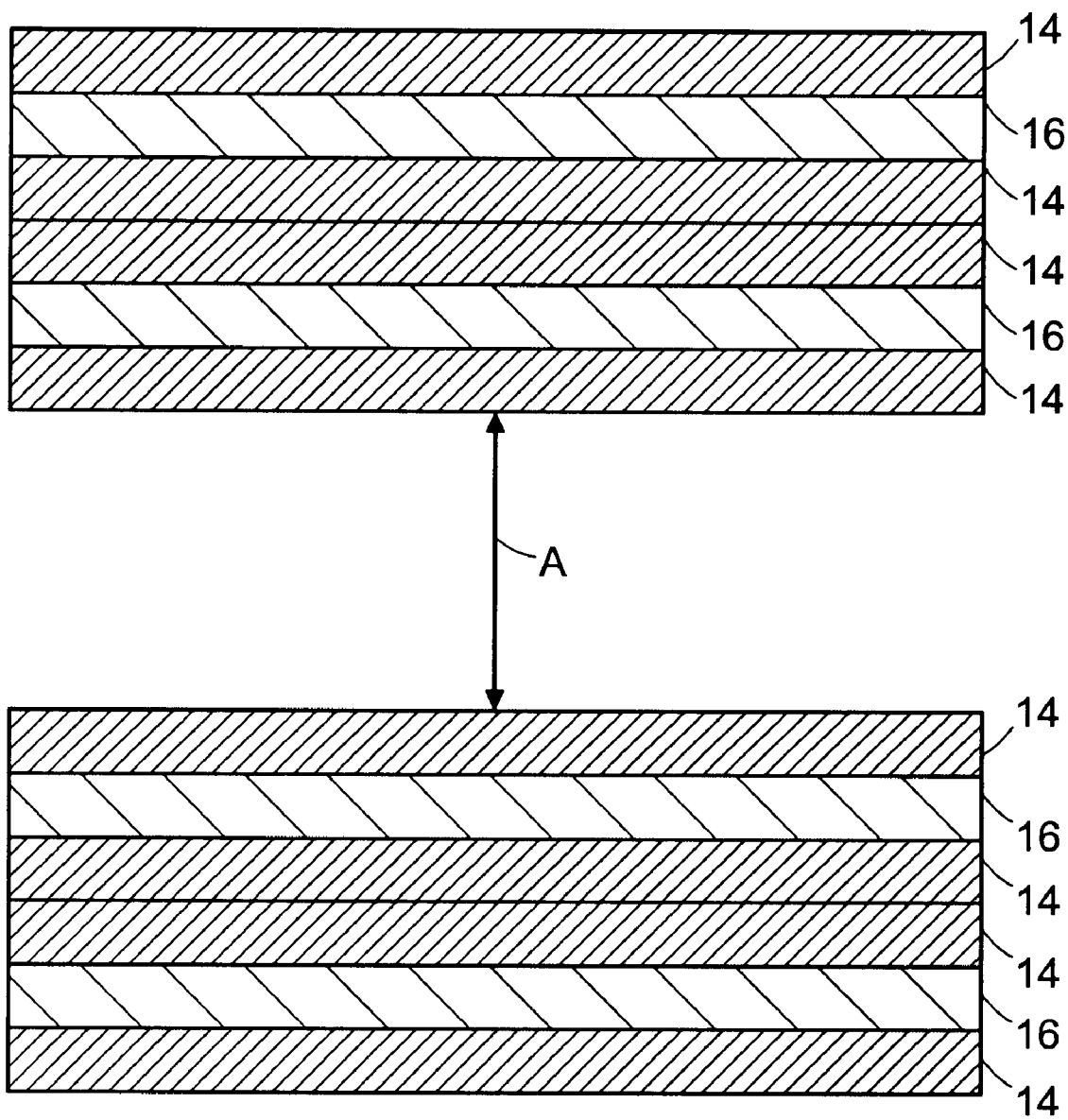
FIG. 5 is a side view of the layers of a prior art laminate sheet prior to cutting.

Laminates 10 have metallic separating plates 12 positioned between each individual laminate 10 (indicated at 110) and on the top and bottom of the laminates adjacent each press platen as in FIG. 1. The plurality of laminates 10 that are positioned in an opening of the curing press is referred to as a "book" 18. Book 18 is typically comprised of 8–30 laminates. The number of laminates and the height of book 18 are more precisely determined by the size of the press opening, and is indicated by arrow "A". A more detailed view of book 18 prior to removal from the opening in the curing press is illustrated in FIG. 4. The number of laminates 10 pressed in an opening is limited by the presence of metallic separating plates 12, which occupy a significant amount of space in book 18. After pressing, book 18 is removed from the opening in the curing press, the metallic separating plates 12 are removed and the laminates 10 are stacked (indicated at 112) and then transferred to a cutting apparatus to be sized. A more detailed view of the stack of laminates after removal of the metallic plates and prior to cutting is illustrated in FIG. 5. The laminates 10 are then conveyed to the cutting apparatus one at a time and are cut to final, predetermined panel dimensions (indicated at 114). Alternatively, the laminates may be individually fed directly to the cutting apparatus after breakdown. The step of removing the metallic plates requires costly automatic breakdown system, or manual labor resulting from the handling of each sheet of laminate individually.

Figure 2:
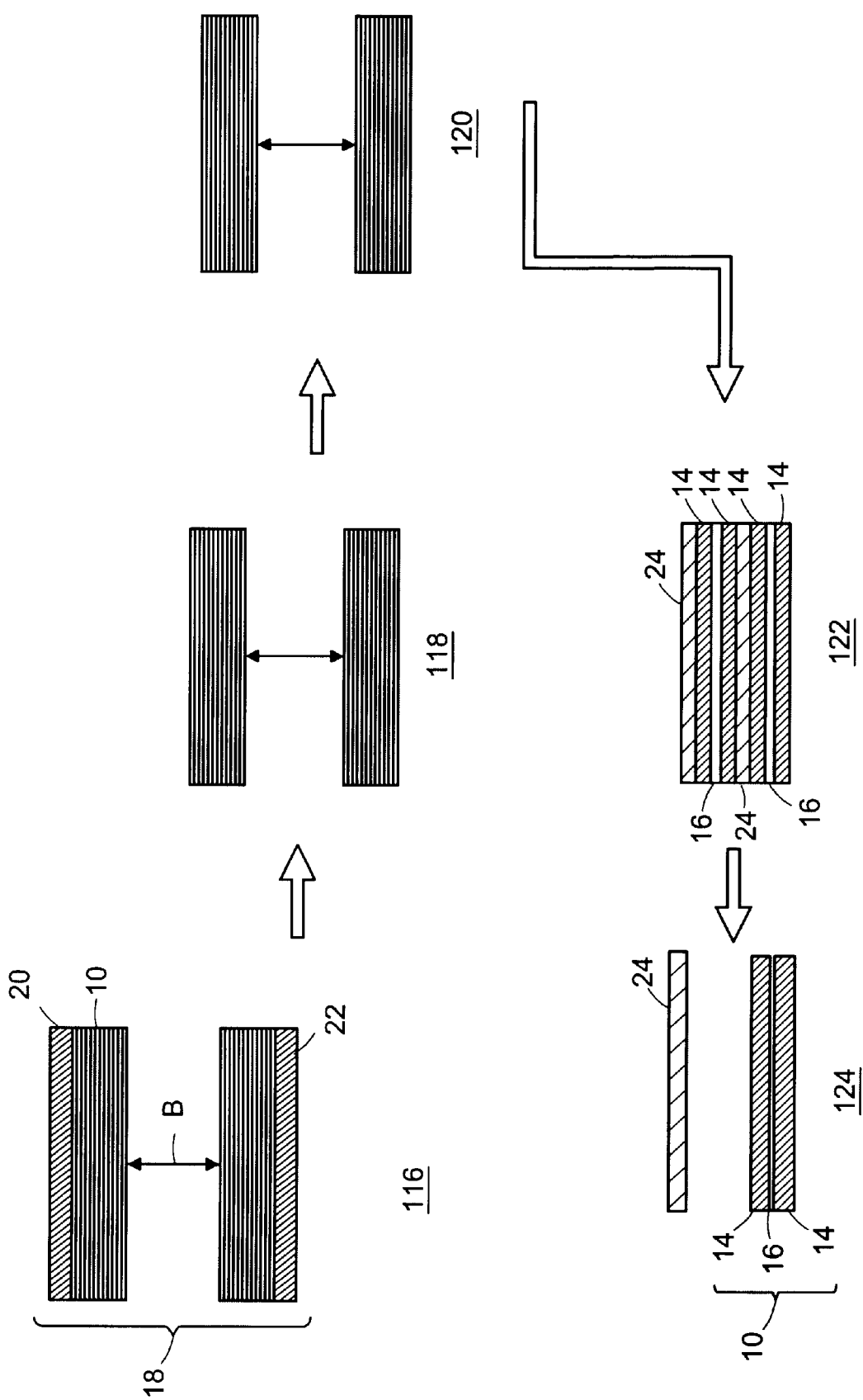
FIG. 2 is a schematic illustration of the novel process according to the present invention.

The process of the present invention as illustrated in FIG. 2, has reduced the time necessary to complete the process and results in an increased quantity and quality of laminate production. In FIG. 2, a book 18 comprised of a plurality of laminates 10 are stacked between upper metallic plate 20 and lower metallic plate 22 of a curing press (not shown). Upper and lower metallic plates 20, 22 maintain the flatness of laminates 10 and assure an even application of pressure from the press upon laminates.

Figure 6:
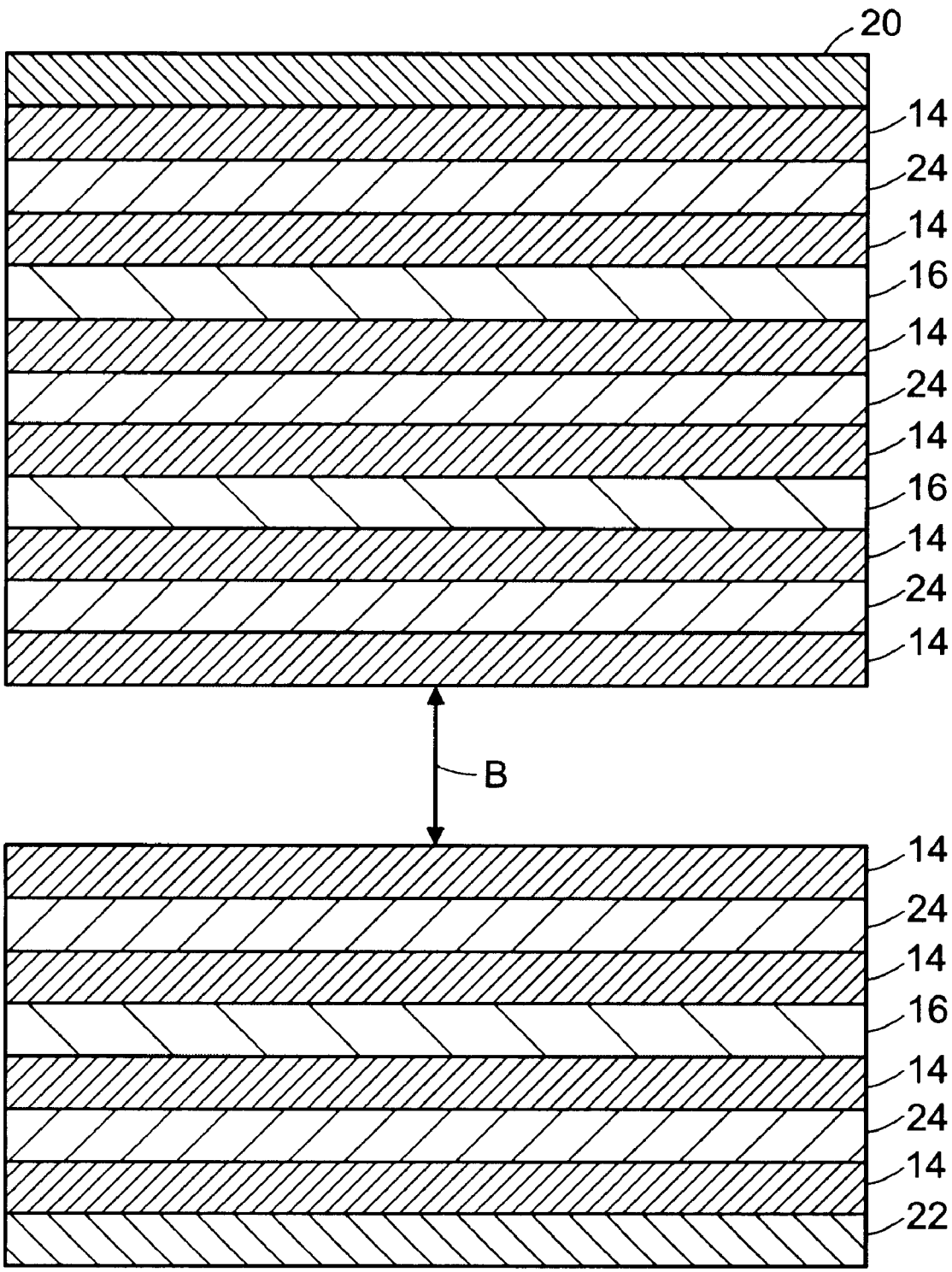
FIG. 6 is a side view of the layers of a laminate book in accordance with the present invention prior to removal from a curing press.

Book 18 generally comprises 20–140 laminates between upper and lower metallic plates 20, 22 depending upon the size of the opening in the curing press, as indicated by arrow "B". A more detailed view of book 18 prior to removal from an opening in the curing press is illustrated in FIG. 6. Unlike the prior art, the process of the present invention comprises a book 18 comprised of a plurality of laminates 10 which are interleaved with thin sacrificial separator components or separator sheets 24. Aluminum separator sheets are advantageous, however, it is essential to note that the invention is not limited to aluminum separator sheets, and separator sheets may also be fabricated from steel, composite, polymer film, copper and other sheet materials that are capable of withstanding the cure temperature of the laminate. Additionally, depending upon the type of laminate sheets utilized, the separator sheet may be freely positioned between the laminate sheets without the use of an adhesive. The separator sheet 24 may also be welded between laminate sheets.

Figure 7:
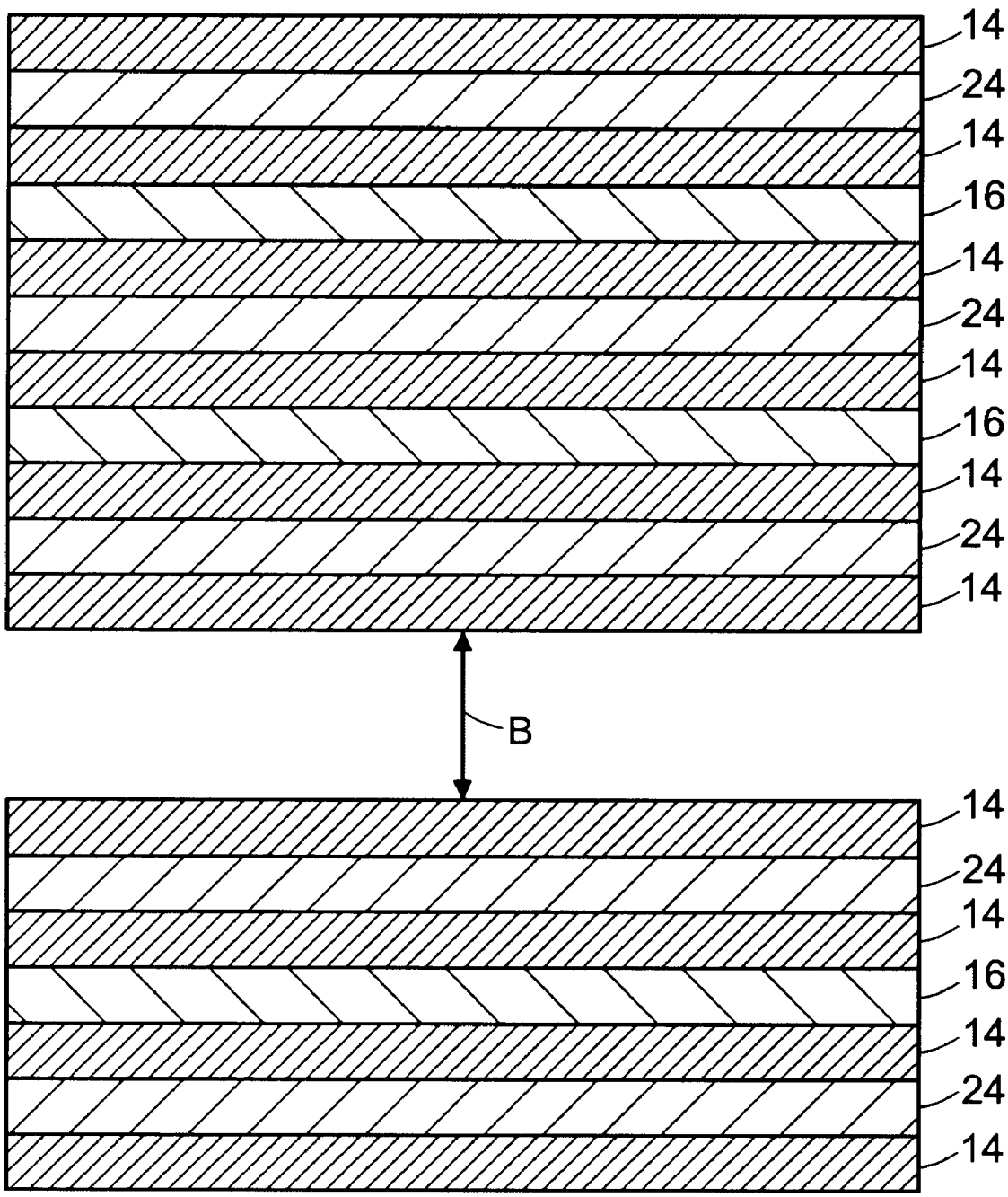
FIG. 7 is a side view of the layers of a laminate book in accordance with the present invention prior to cutting the book.

A sheet of prepreg 16 is positioned between adjacent layers of copper when a plurality of laminate packages comprised of a single piece of aluminum separator sheet positioned between two copper sheets are stacked upon one another. These laminate packages are known in the industry as CAC™ and are commercially available from Gould Electronics Inc., Foil Division, Eastlake, Ohio. A prepreg 16 is a dielectric layer of an epoxy resin-impregnated woven glass fiber. After pressing between upper and lower metallic plates 22, 24, the plurality of laminates 10 (comprising CAC™ 20 and prepreg 16) are removed from the press and separated from upper and lower metallic plates 20, 22, as indicated at 118. The entire book, or a partial book or multiple books 18, with the separator sheets 24 still intact, is then transferred as a mass to a cutting apparatus (not shown). A more detailed view of the book 18 of laminates 10 with separator sheets 24 intact is illustrated in FIG. 7. Prior to cutting, an upper and lower rigid backing material or board such as a phenolic or non-phenolic backer (not shown) is advantageously positioned on the top and bottom of the stack. These backers improve the quality of the cutting. The cutting apparatus is advantageously a paneling saw, although the invention is not limited in this respect and a router or other cutting apparatus may be used.

With the separator sheets 24 remaining in place between copper sheets 14, book 18 is cut on the cutting apparatus to final customer dimensions, indicated at 122. Following cutting and sizing, the stacks of cut panels with the aluminum separator sheets 24 still intact, are inspected and the separator sheets 24 are then separated from the copper clad laminate, as indicated at 124.

The inventive process of the present invention affords large gains in productivity, quality and reduction in labor and costs. The productivity advantages include: increased lamination capacity since time is not lost/wasted breaking down the books to remove the separator sheets and/or metallic plates prior to sizing/cutting of panels; increased fabrication capacity because individual laminates are not handled but rather, entire books are transferred from the press to the cutting and staging individual laminates for the cutting apparatus. Cutting with separator sheets intact and without the use for metallic plates increases the quality of the laminates and reduces the occurrence of imperfections in the laminates. Furthermore, cutting with the separator sheets intact stabilizes the laminate during the cutting step resulting in very high edge quality on the panels. This permits the introduction of the laminates into a clean room environment without the need for secondary cleaning.

It is to be understood that although the above inventive process is discussed with regard to CAC, the invention is not limited in this respect and other separators may be used with the same advantages accorded by the inventive process.

From the foregoing detailed description of the specific embodiments of the invention, it should be apparent that a unique process of preparing laminates for use in the manufacture of printed wiring boards has been described. Although particular embodiments have been disclosed herein in detail, this has been done by way of example for purposes of illustration only, and is not intended to be limiting with respect to the scope of the appended claims that follow. In particular, it is contemplated by the inventor that various substitutions, alterations, and modifications may be made to the invention without departing from the spirit and scope of the invention as defined by the claims.

What is claimed is:

1. A process for cutting multiple laminate foils without breakdown, the process comprising the steps of:
   (a) loading a block of laminates into an opening in a curing press apparatus, said block comprising a plurality of alternating sheets of copper foil and dielectric layers spaced apart from one another by a plurality of separator components;
   (b) pressing the block of laminates into a stack, said stack having a top and bottom surface;
   (c) transferring said stack to a cutting apparatus without removing said separator components; and
   (d) sizing said stack to desired dimensions by cutting the stack with said cutting apparatus.

2. The process as recited in claim 1, wherein said separator component is selected from the group consisting of aluminum, steel, composite, polymer film and copper sheets.

3. The process as recited in claim 1, wherein said separator component is secured to said sheets of copper foil using an adhesive.

4. The process as recited in claim 1, wherein said dielectric layer is comprised of a reinforced or non-reinforced resin sheet.

5. The process as recited in claim 1, wherein said cutting apparatus is a paneling saw.

6. The process as recited in claim 1, wherein said cutting apparatus is a router.

7. The process as recited in claim 1, wherein said block loaded into said opening in said curing press apparatus is comprised of 20–140 laminates.

8. The process as recited in claim 7, wherein said rigid backing board is a phenolic backing board.

9. The process as recited in claim 7, wherein said rigid backing board is a non-phenolic backing board.

10. The process as recited in claim 1, wherein said step of sizing said stack further comprises the step of positioning first and second rigid backing boards on the top and bottom surfaces of said block prior to cutting.

11. The process as recited in claim 1, wherein said block is comprised of a plurality of stacks of laminates which are fabricated from sheets of copper foil having separator sheets are formed of aluminum sheets positioned between each of said sheets of copper foil.

* * * * *